US011988691B2

(12) United States Patent
Takenaka et al.

(10) Patent No.: US 11,988,691 B2
(45) Date of Patent: May 21, 2024

(54) CURRENT MEASUREMENT DEVICE, CURRENT MEASUREMENT METHOD, AND NON-TRANSITORY COMPUTER READABLE STORAGE MEDIUM

(71) Applicant: Yokogawa Electric Corporation, Tokyo (JP)

(72) Inventors: Kazuma Takenaka, Musashino (JP); Kotaro Ogawa, Musashino (JP); Minako Terao, Musashino (JP); Naoki Noguchi, Musashino (JP); Saki Kobako, Musashino (JP); Fumitake Terao, Musashino (JP); Satoshi Yoshitake, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 242 days.

(21) Appl. No.: 17/620,196

(22) PCT Filed: Jun. 17, 2020

(86) PCT No.: PCT/JP2020/023735
§ 371 (c)(1),
(2) Date: Dec. 17, 2021

(87) PCT Pub. No.: WO2020/256008
PCT Pub. Date: Dec. 24, 2020

(65) Prior Publication Data
US 2022/0244295 A1 Aug. 4, 2022

(30) Foreign Application Priority Data
Jun. 20, 2019 (JP) ................................. 2019-114925

(51) Int. Cl.
*G01R 15/20* (2006.01)
*G01R 19/25* (2006.01)
*G01R 31/58* (2020.01)

(52) U.S. Cl.
CPC ....... *G01R 15/202* (2013.01); *G01R 19/2506* (2013.01); *G01R 31/58* (2020.01)

(58) Field of Classification Search
CPC ... G01R 15/202; G01R 19/2506; G01R 31/58
See application file for complete search history.

(56) References Cited

U.S. PATENT DOCUMENTS 11,169,183 B2 * 11/2021 Nakagawa ........... G01R 15/146
2004/0201373 A1 10/2004 Kato
(Continued)

FOREIGN PATENT DOCUMENTS

| JP | 3-276002 A | 12/1991 |
| JP | 2001-343401 A | 12/2001 |

(Continued)

*Primary Examiner* — Reena Aurora
(74) *Attorney, Agent, or Firm* — RANKIN, HILL & CLARK LLP

(57) ABSTRACT

The current measurement device (1, 2) includes a first sensor (SE1) configured to detect a direct current magnetic field and a low-frequency alternating current magnetic field generated due to the current (1) flowing through the conductor (MC) to be measured, a second sensor (SE2) configured to detect alternating current magnetic fields from a low frequency to a high frequency generated due to the current (I) flowing through the conductor to be measured, a first calculator (21, 21A) configured to calculate the current flowing through the conductor to be measured from a detection result of the first sensor using distance information indicating a distance (r) between the first sensor (SE1) and the conductor (MC) to be measured, a second calculator (22) configured to calculate the current flowing through the conductor to be measured from a detection result of the second sensor, and (Continued)

a synthesizer (23) configured to synthesize a calculation result of the first calculator with a calculation result of the second calculator.

20 Claims, 10 Drawing Sheets

(56) References Cited

U.S. PATENT DOCUMENTS

| | | |
|---|---|---|
| 2011/0202295 A1 | 8/2011 | Tamura et al. |
| 2014/0253109 A1 | 9/2014 | Singh et al. |
| 2015/0301088 A1 | 10/2015 | Soneda et al. |
| 2018/0120357 A1 | 5/2018 | Takenaka |
| 2022/0214383 A1* | 7/2022 | Takenaka ................. G01D 5/14 |

FOREIGN PATENT DOCUMENTS

| | | | |
|---|---|---|---|
| JP | 2004-257905 | A | 9/2004 |
| JP | 2005-55300 | A | 3/2005 |
| JP | 2010-286295 | A | 12/2010 |
| JP | 2011-164019 | A | 8/2011 |
| JP | 2015-206674 | A | 11/2015 |
| JP | 2015-222176 | A | 12/2015 |
| JP | 2018-54407 | A | 4/2018 |
| JP | 2018-072220 | A | 5/2018 |

\* cited by examiner

FIG. 9
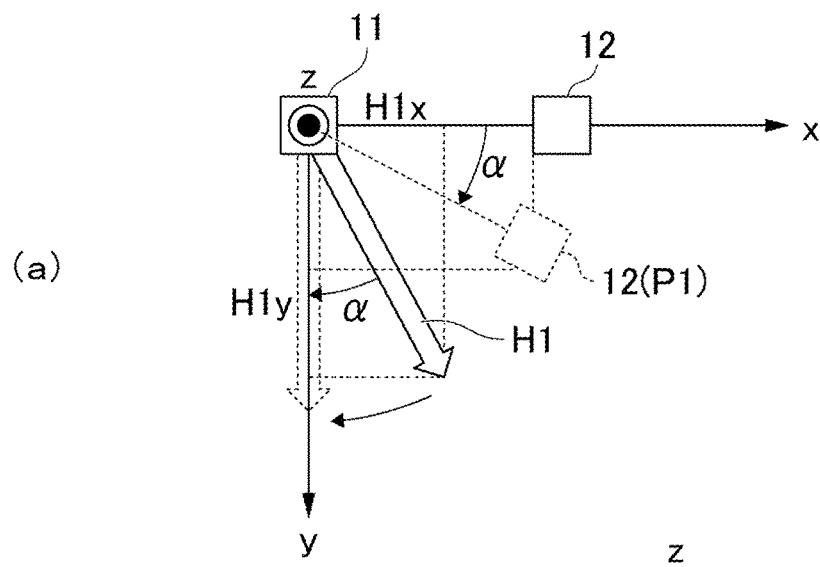
(a)
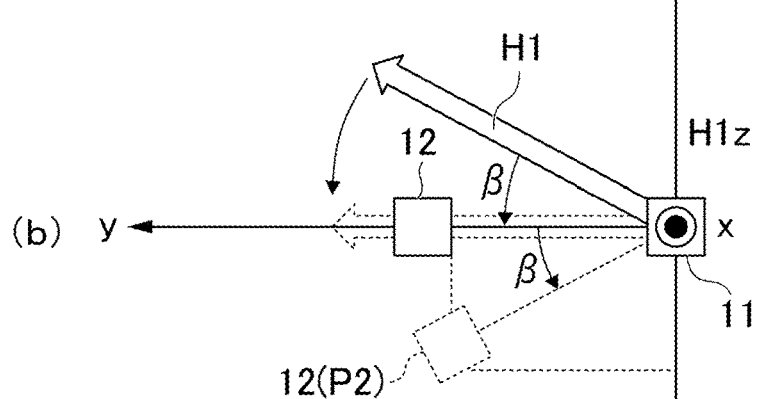
(b)
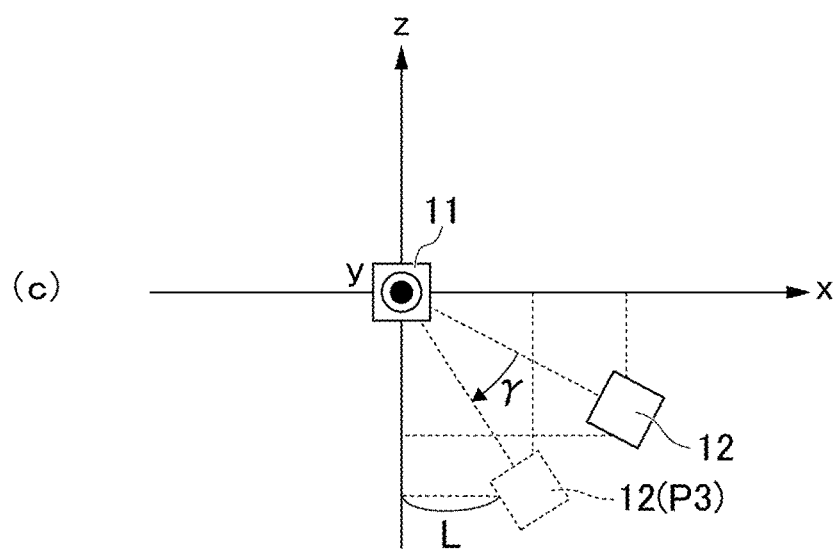
(c)

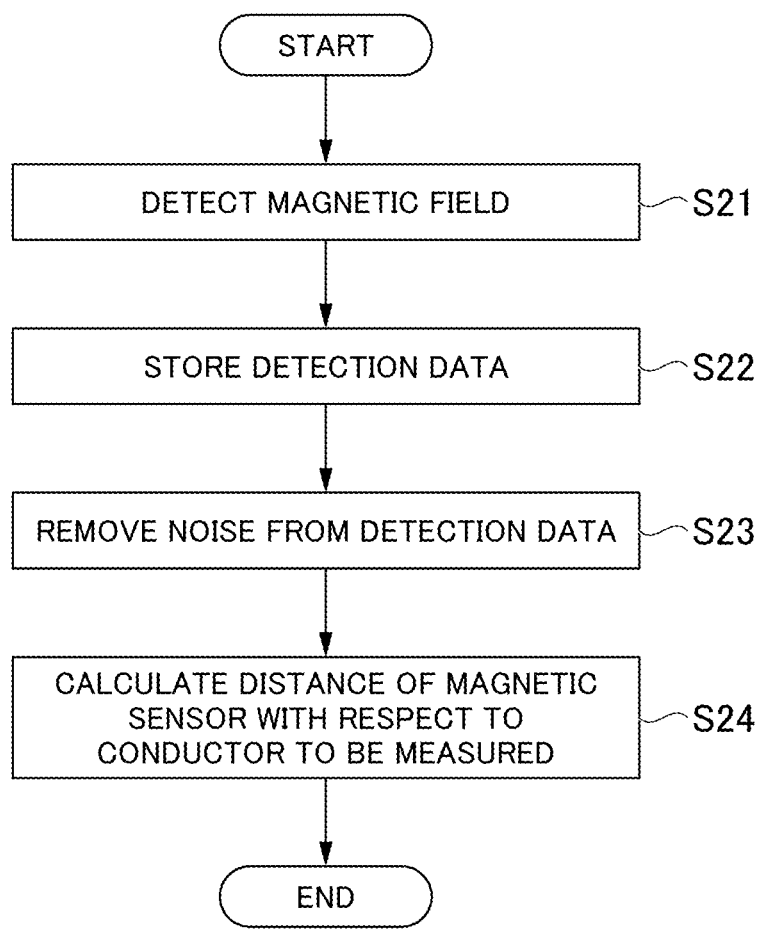

CURRENT MEASUREMENT DEVICE, CURRENT MEASUREMENT METHOD, AND NON-TRANSITORY COMPUTER READABLE STORAGE MEDIUM

TECHNICAL FIELD

The present invention relates to a current measurement device, a current measurement method, and a non-transitory computer readable storage medium.

BACKGROUND ART

In the related art, various current measurement devices capable of wirelessly measuring a current flowing through a conductor to be measured have been developed. Typical examples of such current measurement devices include a current transformer (CT) type current measurement device, a zero flux type current measurement device, a Rogowski type current measurement device, a Hall element type current measurement device, and the like.

For example, the CT type current measurement device and the zero flux type current measurement device measure a current flowing through a conductor to be measured by providing a magnetic core around which a coil is wound near the conductor to be measured and detecting a current flowing through the coil (a secondary side) so that a magnetic flux generated in the magnetic core due to the current flowing through the conductor (a primary side) to be measured is canceled out. Also, the Rogowski type current measurement device measures a current flowing through a conductor to be measured by providing a Rogowski coil (an air-core coil) near the conductor to be measured and detecting a voltage induced in the Rogowski coil when a magnetic field generated by an alternating current (AC) flowing through the conductor to be measured crosses the Rogowski coil.

The following Patent Literature 1 discloses an example of the zero flux type current measurement device. Also, the following Patent Literature 2 discloses a current measurement device using a plurality of magnetic sensors. Specifically, in the current measurement device disclosed in the following Patent Literature 2, two magnetic sensors are arranged at different distances with respect to the conductor to be measured, distances between the magnetic sensors and the conductor to be measured are calculated from outputs of the magnetic sensors, and a magnitude of a current flowing through the conductor to be measured is calculated using the calculated distances.

CITATION LIST

Patent Literature

[Patent Literature 1]
  Japanese Unexamined Patent Application Publication No. 2005-55300
[Patent Literature 2]
  Japanese Unexamined Patent Application Publication No. 2011-164019

SUMMARY OF INVENTION

Technical Problem

Incidentally, it is considered that it is possible to measure a current using one current measurement device and improve convenience dramatically if a current flowing through the conductor to be measured can be measured regardless of whether the current is a direct current (DC) or an AC when the current flowing through the conductor to be measured is measured. Also, it is considered that it is possible to measure a current easily and efficiently if the current flowing through the conductor to be measured can be measured wirelessly. Furthermore, it is considered that the installation in a small space will be possible if a size of the current measurement device is small.

The present invention has been made in view of the above circumstances and an objective of the present invention is to provide a current measurement device, a current measurement method, and a non-transitory computer readable storage medium capable of measuring a DC and an AC wirelessly in a small size.

Solution to Problem

According to a first or second aspect of the present invention for solving the above-described problems, there is provided a current measurement device (1 or 2) for measuring a current (I) flowing through a conductor (MC) to be measured, the current measurement device including: a first sensor (SE1) configured to detect a direct current (DC) magnetic field and a low-frequency alternating current (AC) magnetic field generated due to the current flowing through the conductor to be measured; a second sensor (SE2) configured to detect alternating current magnetic fields from a low frequency to a high frequency generated due to the current flowing through the conductor to be measured; a first calculator (21 or 21A) configured to calculate the current flowing through the conductor to be measured from a detection result of the first sensor using distance information indicating a distance (r) between the first sensor and the conductor to be measured; a second calculator (22) configured to calculate the current flowing through the conductor to be measured from a detection result of the second sensor; and a synthesizer (23) configured to synthesize a calculation result of the first calculator with a calculation result of the second calculator.

Also, in the current measurement device according to the first aspect of the present invention, the distance information is pre-stored in the first calculator and the current measurement device includes a fixing mechanism (FM) configured to specify a distance of the first sensor with respect to the conductor to be measured as a distance indicated in the distance information pre-stored in the first calculator.

Also, the current measurement device according to the first aspect of the present invention includes a sensor head (10) having the first sensor, the second sensor, and the fixing mechanism; and a circuit (20) having the first calculator, the second calculator, and the synthesizer.

Also, the current measurement device according to the second aspect of the present invention further includes two or more triaxial magnetic sensors (11 and 12) which are arranged so that a magnetism sensing direction and a relative position have a prescribed relationship with respect to the first sensor, wherein the first calculator includes a distance information calculator (21c) configured to calculate the distance information on the basis of detection results of the two or more triaxial magnetic sensors.

Also, in the current measurement device according to the second aspect of the present invention, the first calculator further includes a noise canceller (21b) configured to remove noise components included in the detection results of the two or more triaxial magnetic sensors, and the distance information calculator calculates the distance information using the detection results of the two or more triaxial magnetic sensors from which the noise components are removed by the noise canceller.

Also, the current measurement device according to the second aspect of the present invention includes a sensor head (10A) having the first sensor, the second sensor, and the two or more triaxial magnetic sensors; and a circuit (20A) having the first calculator, the second calculator, and the synthesizer.

Also, in the current measurement device according to the first or second aspect of the present invention, the synthesizer includes a first filter (23a) configured to remove a high-frequency component from the calculation result of the first calculator and pass a low-frequency component; a second filter (23b) configured to remove a low-frequency component from the calculation result of the second calculator and pass a high-frequency component; an adjuster (23c) configured to adjust at least one of a level of a first signal output from the first filter or a level of a second signal output from the second filter; and an adder (23d) configured to perform an addition operation on the first signal and the second signal for which level adjustment has been performed by the adjuster.

According to a first or second aspect of the present invention for solving the above-described problems, there is provided a current measurement method that is executed by a current measurement device (1 or 2) including a first sensor (SE1), a second sensor (SE2), a first calculator (21 or 21A), a second calculator (22), and a synthesizer (23) and configured to measure a current (I) flowing through a conductor (MC) to be measured, the current measurement method including: detecting, by the first sensor, a direct current magnetic field and a low-frequency alternating current magnetic field generated due to the current flowing through the conductor to be measured; detecting, by the second sensor, alternating current magnetic fields from a low frequency to a high frequency generated due to the current flowing through the conductor to be measured; calculating, by the first calculator, the current flowing through the conductor to be measured from a detection result of the first sensor using distance information indicating a distance (r) between the first sensor and the conductor to be measured; calculating, by the second calculator, the current flowing through the conductor to be measured from a detection result of the second sensor; and synthesizing, by the synthesizer, a calculation result of the first calculator with a calculation result of the second calculator.

Also, in the current measurement method according to the first aspect of the present invention, the distance information is pre-stored in the first calculator, and the current measurement device includes a fixing mechanism (FM) configured to specify a distance of the first sensor with respect to the conductor to be measured as a distance indicated in the distance information pre-stored in the first calculator.

Also, in the current measurement method according to the first aspect of the present invention, the current measurement device includes a sensor head (10) having the first sensor, the second sensor, and the fixing mechanism; and a circuit (20) having the first calculator, the second calculator, and the synthesizer.

Also, in the current measurement method according to the second aspect of the present invention, the current measurement device further includes two or more triaxial magnetic sensors (11 and 12) which are arranged so that a magnetism sensing direction and a relative position have a prescribed relationship with respect to the first sensor, the first calculator includes a distance information calculator (21c), and the distance information calculator calculates the distance information on the basis of detection results of the two or more triaxial magnetic sensors.

Also, in the current measurement method according to the second aspect of the present invention, the first calculator further includes a noise canceller (21b), the noise canceller removes noise components included in the detection results of the two or more triaxial magnetic sensors, and the distance information calculator calculates the distance information using the detection results of the two or more triaxial magnetic sensors from which the noise components are removed by the noise canceller.

Also, in the current measurement method according to the second aspect of the present invention, the current measurement device includes a sensor head (10A) having the first sensor, the second sensor, and the two or more triaxial magnetic sensors; and a circuit (20A) having the first calculator, the second calculator, and the synthesizer.

Also, in the current measurement method according to the first or second aspect of the present invention, the synthesizer includes a first filter (23a), a second filter (23b), an adjuster (23c), and an adder (23d), the first filter removes a high-frequency component from the calculation result of the first calculator and passes a low-frequency component, the second filter removes a low-frequency component from the calculation result of the second calculator and passes a high-frequency component, the adjuster adjusts at least one of a level of a first signal output from the first filter or a level of a second signal output from the second filter, and the adder performs an addition operation on the first signal and the second signal for which level adjustment has been performed by the adjuster.

According to first and second aspects of the present invention for solving the above-described problems, there is provided a non-transitory computer readable storage medium storing one or more programs that are executed in a current measurement device (1 or 2), which includes a first sensor (SE1), a second sensor (SE2), a first calculator (21 or 21A), a second calculator (22), and a synthesizer (23) and measures a current (I) flowing through a conductor (MC) to be measured, wherein the one or more programs cause the first sensor to detect a direct current magnetic field and a low-frequency alternating current magnetic field generated due to the current flowing through the conductor to be measured, cause the second sensor to detect alternating current magnetic fields from a low frequency to a high frequency generated due to the current flowing through the conductor to be measured, cause the first calculator to calculate the current flowing through the conductor to be measured from a detection result of the first sensor using distance information indicating a distance (r) between the first sensor and the conductor to be measured, cause the second calculator to calculate the current flowing through the conductor to be measured from a detection result of the second sensor, and cause the synthesizer to synthesize a calculation result of the first calculator with a calculation result of the second calculator.

Also, in the non-transitory computer readable storage medium according to the first aspect of the present invention, the distance information is pre-stored in the first calculator, and the current measurement device includes a fixing mechanism (FM) configured to specify a distance of the first sensor with respect to the conductor to be measured as a distance indicated in the distance information pre-stored in the first calculator.

Also, in the non-transitory computer readable storage medium according to the first aspect of the present invention, the current measurement device includes a sensor head (10) having the first sensor, the second sensor, and the fixing mechanism; and a circuit (20) having the first calculator, the second calculator, and the synthesizer.

Also, in the non-transitory computer readable storage medium according to the second aspect of the present invention, the current measurement device further includes two or more triaxial magnetic sensors (11 and 12) which are arranged so that a magnetism sensing direction and a relative position have a prescribed relationship with respect to the first sensor, the first calculator includes a distance information calculator (21c), and the one or more programs cause the distance information calculator to calculate the distance information on the basis of detection results of the two or more triaxial magnetic sensors.

Also, in the non-transitory computer readable storage medium according to the second aspect of the present invention, the first calculator further includes a noise canceller (21b), the one or more programs cause the noise canceller to remove noise components included in the detection results of the two or more triaxial magnetic sensors, and the one or more programs cause the distance information calculator to calculate the distance information using the detection results of the two or more triaxial magnetic sensors from which the noise components are removed by the noise canceller.

Also, in the non-transitory computer readable storage medium according to the second aspect of the present invention, the current measurement device includes a sensor head (10A) having the first sensor, the second sensor, and the two or more triaxial magnetic sensors; and a circuit (20A) having the first calculator, the second calculator, and the synthesizer.

Advantageous Effects of Invention

According to the present invention, it is possible to measure a direct current and an alternating current wirelessly in a small size.

BRIEF DESCRIPTION OF DRAWINGS

FIG. 9 is a diagram for describing a method of calculating an interval L in a Y-direction of a triaxial magnetic sensor.

FIG. 10 is a flowchart showing a distance calculation process performed in the second embodiment of the present invention.

DESCRIPTION OF EMBODIMENTS

Figure 1:
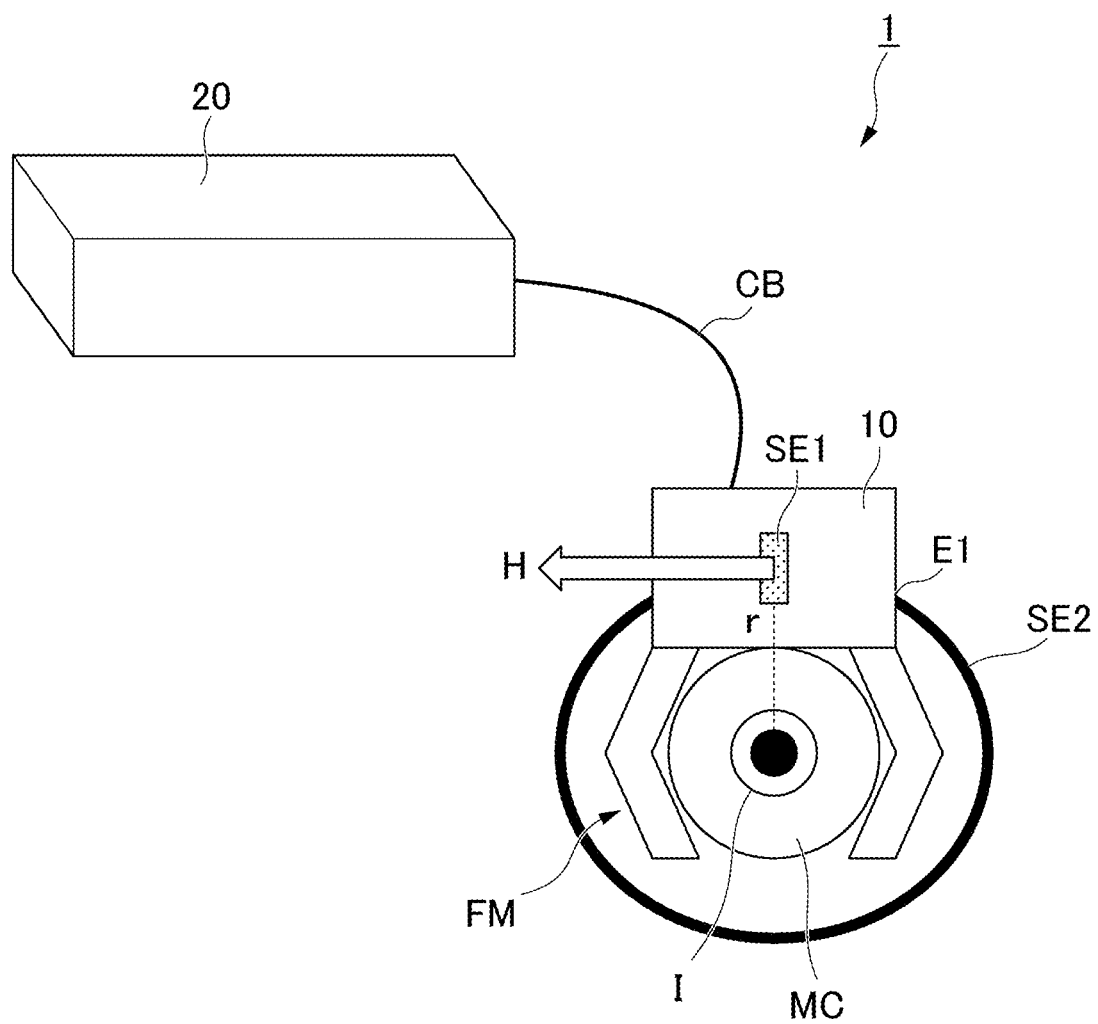
FIG. 1 is a diagram schematically showing a current measurement device according to a first embodiment of the present invention.

Hereinafter, current measurement devices according to embodiments of the present invention will be described in detail with reference to the drawings. Hereinafter, an overview of the embodiments of the present invention will be described first and then details of each embodiment of the present invention will be described.

[Overview]

The embodiments of the present invention enable a direct current (DC) and an alternating current (AC) to be measured wirelessly in a small size. Specifically, the installation in a small space is possible when a current is measured and it is possible to measure a DC and an AC of up to about several tens of megahertz [MHz] wirelessly. Also, it possible to set an installation position and an installation direction flexibly with respect to a conductor to be measured.

In recent years, in a process of developing hybrid vehicles (HVs) and electric vehicles (EVs), the measurement of a current flowing through a pin of a power semiconductor such as silicon carbide (SiC) or a current flowing through a bus bar after assembly has been required. Many power semiconductors have a small pin pitch and a bus bar may be installed at a place where a surrounding space is limited. Thus, there is a demand for a current measurement device that enables such a power semiconductor, such a bus bar, or the like to be installed flexibly at the time of current measurement. Also, in a hybrid vehicle or an electric vehicle, for example, a DC supplied from a battery or an AC flowing through a motor is handled, so that a compact current measurement device capable of measuring a DC and an AC wirelessly is desired.

However, it is difficult to install the zero flux type current measurement device disclosed in Patent Literature 1 described above in a small space because it is necessary to provide a magnetic core having a certain size (for example, about several tens of centimeters [cm]) near a conductor to be measured. Also, it is difficult for the Rogowski-type current measurement device described above to measure a DC in principle because a voltage induced in the Rogowski coil is detected. Also, in a low-frequency band, an output signal is weak and a phase is shifted, so that the accuracy of measurement is poor. Also, in the current measurement device disclosed in Patent Literature 2 described above, an arrangement of a magnetic sensor is limited and a flexible arrangement is difficult because it is necessary to cause a magnetism sensing direction of the magnetic sensor to match a circumferential direction of the conductor to be measured.

In the embodiment of the present invention, a first sensor configured to detect a DC magnetic field and a low-frequency AC magnetic field generated due to the current flowing through the conductor to be measured and a second sensor configured to detect AC magnetic fields from a low frequency to a high frequency generated due to the current flowing through the conductor to be measured are provided. The current flowing through the conductor to be measured is calculated from a detection result of the first sensor using distance information indicating a distance between the first sensor and the conductor to be measured, the current flowing through the conductor to be measured is calculated from a detection result of the second sensor, and calculation results are synthesized. Thereby, it is possible to measure a DC and an AC wirelessly in a small size.

First Embodiment

<Configuration of Current Measurement Device>

FIG. 1 is a diagram schematically showing a current measurement device according to a first embodiment of the present invention. As shown in FIG. 1, a current measurement device 1 of the present embodiment includes a sensor head 10 and a circuit 20 connected by a cable CB, and measures a current I flowing through a conductor MC to be measured wirelessly. The conductor MC to be measured is, for example, any conductor such as a pin or a bus bar of a power semiconductor. Hereinafter, for the sake of simplicity of description, it is assumed that the conductor MC to be measured is a cylindrical conductor.

The sensor head 10 is a member for measuring the current I flowing through the conductor MC to be measured wirelessly. The sensor head 10 is formed of a material (for example, a resin or the like) that does not block a magnetic field generated due to the current I (for example, a magnetic field H shown in FIG. 1). The sensor head 10 is used as a probe for measuring the current I flowing through the conductor MC to be measured wirelessly.

As shown in FIG. 1, the sensor head 10 is fixedly arranged with respect to the conductor MC to be measured when the current I flowing through the conductor MC to be measured is measured. Thus, the sensor head 10 may come into physical contact with the conductor MC to be measured. However, the sensor head 10 is electrically insulated from the conductor MC to be measured and the current I flowing through the conductor MC to be measured does not flow into the sensor head 10. Thus, it can be said that the sensor head 10 is for measuring the current I flowing through the conductor MC to be measured wirelessly.

In the sensor head 10, a magnetic sensor SE1 (a first sensor), a Rogowski sensor SE2 (a second sensor), and a fixing mechanism FM are provided. The magnetic sensor SE1 detects a DC magnetic field and an AC magnetic field of a low frequency (for example, up to about several hundreds of hertz [Hz]) generated due to the current I flowing through the conductor MC to be measured. For example, when the current I flowing through the conductor MC to be measured is a DC, the magnetic field H shown in FIG. 1 is detected.

Because the magnetic sensor SE1 is used for measuring the current I flowing through the conductor MC to be measured, responsiveness is required. The magnetic sensor SE1 preferably has, for example, a delay time of less than 1 [msec]. The magnetic sensor SE1 may be an analog sensor or a digital sensor as long as a response speed is sufficiently fast. The number of detection axes of the magnetic sensor SE1 is preferably three, four, or more, but may be one or two. When the number of detection axes of the magnetic sensor SE1 is one, the magnetic sensor SE1 is arranged within the sensor head 10 so that the detection axis matches a direction of the magnetic field (a tangential direction of the conductor MC to be measured) generated due to the current I when the sensor head 10 is fixed to the conductor MC to be measured using the fixing mechanism FM.

The magnetic sensor SE1 with low noise is used to ensure the measurement accuracy of the current measurement device 1. For example, the magnetic sensor SE1 for which a magnitude of a noise component included in a detection result of the magnetic sensor SE1 is about 0.1% of a measurement range of the current measurement device 1 is used. Further, as the magnetic sensor SE1, for example, a Hall element, a magnetoresistive effect element, or the like can be used.

The Rogowski sensor SE2 detects AC magnetic fields from a low frequency (for example, several hundreds of hertz [Hz]) to a high frequency (for example, several tens of megahertz [MHz]) generated due to the current I flowing through the conductor MC to be measured. The Rogowski sensor SE2 is a sensor using a Rogowski coil (an air-core coil) and is arranged in a state in which the circumference of the conductor MC to be measured is surrounded thereby. Further, the Rogowski sensor SE2 is configured such that one end E1 of the Rogowski sensor SE2 can be attached to and detached from the sensor head 10 so that the arrangement near the conductor MC to be measured is facilitated.

The fixing mechanism FM is a mechanism for fixing the sensor head 10 to the conductor MC to be measured. This fixing mechanism FM is provided to fix the sensor head 10 to the conductor MC to be measured so that the distance of the magnetic sensor SE1 with respect to the conductor MC to be measured is a prescribed distance r. As the fixing mechanism FM, for example, a resin leaf spring or the like configured to sandwich a side surface of the conductor MC to be measured can be used or a screw mechanism with a guide can also be adopted. Further, the sensor head 10 may be fixed in a state in which the sensor head 10 comes into physical contact with the conductor MC to be measured or may be fixed in a state in which the sensor head 10 is separated from the conductor MC to be measured.

The reason why the distance of the magnetic sensor SE1 with respect to the conductor MC to be measured is set to a certain distance r by the fixing mechanism FM is that the current I flowing through the conductor MC to be measured is calculated using only a measurement result of the magnetic sensor SE1. That is, the current I flowing through the conductor MC to be measured is calculated by a product of the distance r with respect to the conductor MC to be measured to a measurement point, the magnetic field H measured at the measurement point, and a constant ($2\pi$) according to Ampere's law. Although the magnetic field H can be measured by the magnetic sensor SE1, it is difficult to calculate the current I flowing through the conductor MC to be measured if the distance of the magnetic sensor SE1 with respect to the conductor MC to be measured is indefinite. In the present embodiment, the distance of the magnetic sensor SE1 with respect to the conductor MC to be measured is set to the certain distance r by the fixing mechanism FM, so that only the measurement result of the magnetic sensor SE1 is used to calculate the current I flowing through the conductor MC to be measured.

The circuit 20 measures the current I flowing through the conductor MC to be measured on the basis of detection results (detection results of the magnetic sensor SE1 and the Rogowski sensor SE2) output from the sensor head 10. The circuit 20 externally outputs or displays a result of measuring the current I. Although any cable can be used as the cable CB for connecting the sensor head 10 and the circuit 20, a flexible cable is desirable, an easy-to-manage cable is desirable, and a cable whose disconnection is unlikely to occur is desirable.

Figure 2:
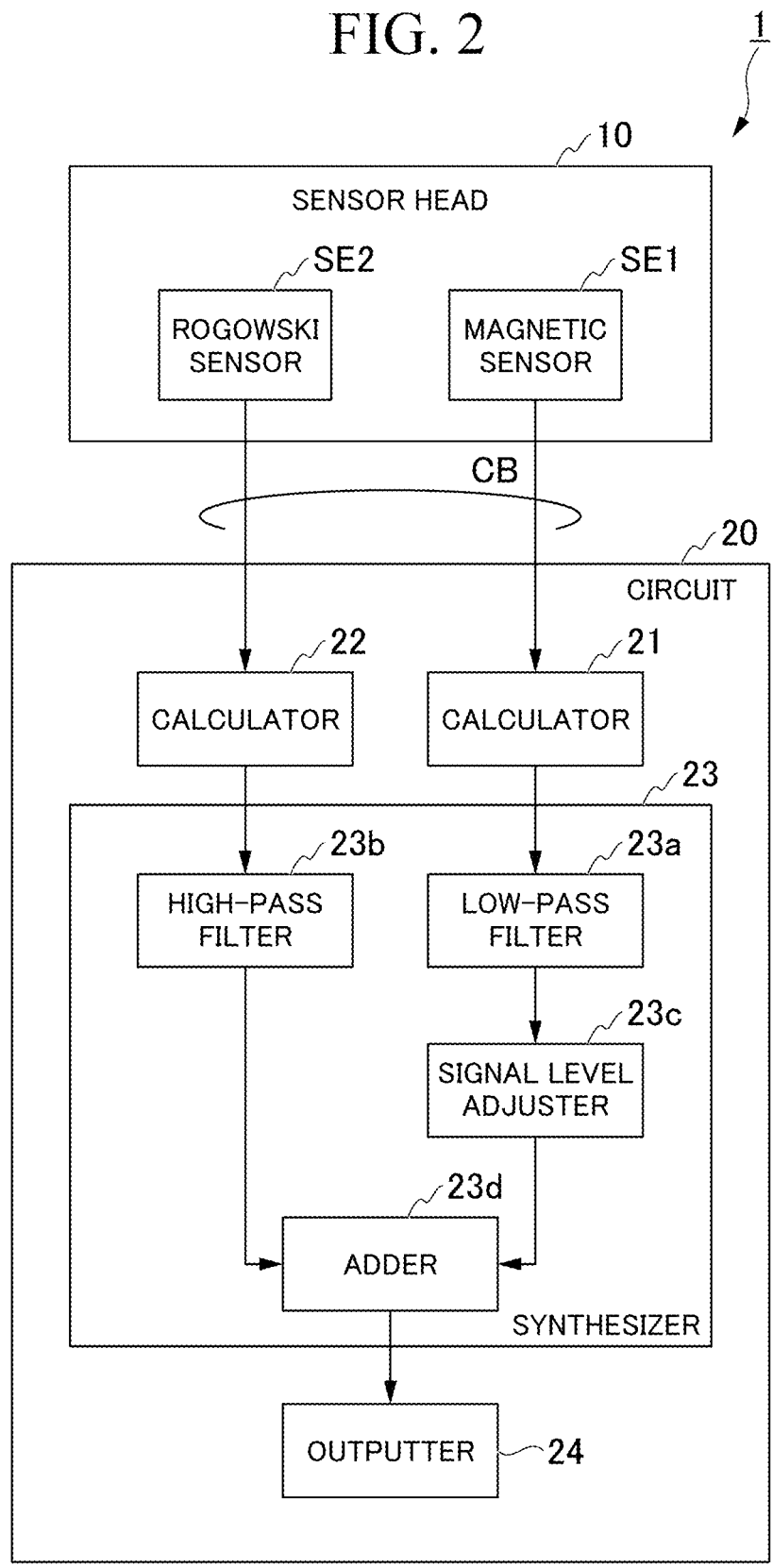
FIG. 2 is a block diagram showing a main configuration of the current measurement device according to the first embodiment of the present invention.

FIG. 2 is a block diagram showing a main configuration of the current measurement device according to the first embodiment of the present invention. Further, in FIG. 2, the same reference signs are given to blocks corresponding to the components shown in FIG. 1. Hereinafter, details of an internal configuration of the circuit 20 will be mainly described with reference to FIG. 2. As shown in FIG. 2, the circuit 20 includes a calculator 21 (a first calculator), a calculator 22 (a second calculator), a synthesizer 23, and an outputter 24.

The calculator 21 calculates the current I flowing through the conductor MC to be measured from the detection result of the magnetic sensor SET. Here, because the magnetic sensor SE1 detects a DC magnetic field and a low-frequency AC magnetic field as described above, the current I calculated by the calculator 21 has a DC and low-frequency component. The calculator 21 pre-stores distance information indicating the distance r from the conductor MC to be measured to the measurement point (a position where the magnetic sensor SE1 should be arranged). The calculator 21 calculates the current I flowing through the conductor MC to be measured by calculating the product of the distance r indicated in the distance information, the detection result (the magnetic field H) of the magnetic sensor SE1, and the constant ($2\pi$).

The calculator 22 calculates the current I flowing through the conductor MC to be measured from the detection result of the Rogowski sensor SE2. Here, because the Rogowski sensor SE2 detects the AC magnetic fields from the low frequency to the high frequency as described above, the current I calculated by the calculator 22 has components from the low frequency to the high frequency. The detection result of the Rogowski sensor SE2 indicates a voltage induced in the Rogowski coil due to the AC magnetic field generated around the current I (the AC) flowing through the conductor MC to be measured. The calculator 22 calculates the current I flowing through the conductor MC to be measured by performing a calculation operation of converting the detection result (the voltage) of the Rogowski sensor SE2 into a current.

The synthesizer 23 synthesizes the calculation result of the calculator 21 with the calculation result of the calculator 22. Specifically, the synthesizer 23 includes a low-pass filter 23a (a first filter), a high-pass filter 23b (a second filter), a signal level adjuster 23c (an adjuster), and an adder 23d. The low-pass filter 23a removes the high-frequency component from the calculation result of the calculator 21 and passes the low-frequency component to obtain a signal having a desired frequency characteristic suitable for a synthesis process to be described below. The high-pass filter 23b removes the low-frequency component from the calculation result of the calculator 22 and passes the high-frequency component to obtain a signal having a desired frequency characteristic suitable for the synthesis process to be described below.

The signal level adjuster 23c adjusts a level of the signal (a first signal) output from the low-pass filter 23a. For example, when a DC and an AC having the same peak value are flowing through the conductor MC to be measured, the signal level adjuster 23c performs an adjustment operation so that a signal level of the signal output from the low-pass filter 23a is the same as a signal level of the signal output from the high-pass filter 23b. As the signal level adjuster 23c, for example, a variable resistor can be used.

Further, although the signal level adjuster 23c configured to adjust only the level of the signal (the first signal) output from the low-pass filter 23a is provided in the present embodiment, the present invention is not limited thereto. For example, a signal level adjuster for adjusting a level of the signal (a second signal) output from the high-pass filter 23b may be provided in place of the signal level adjuster 23c or in addition to the signal level adjuster 23c. Alternatively, a signal level adjuster configured to be able to adjust each of the level of the first signal and the level of the second signal may be provided.

The adder 23d adds the signal (the first signal) whose signal level has been adjusted by the signal level adjuster 23c to the signal (the second signal) output from the high-pass filter 23b. The signal (the first signal) whose signal level has been adjusted by the signal level adjuster 23c is a signal indicating a DC and low-frequency component of the current I. The signal (the second signal) output from the high-pass filter 23b is a signal indicating a high-frequency component of the current I. Thus, by performing an addition operation on the above signals, it is possible to obtain a signal having components of a DC and an AC of a high frequency.

Figure 3:
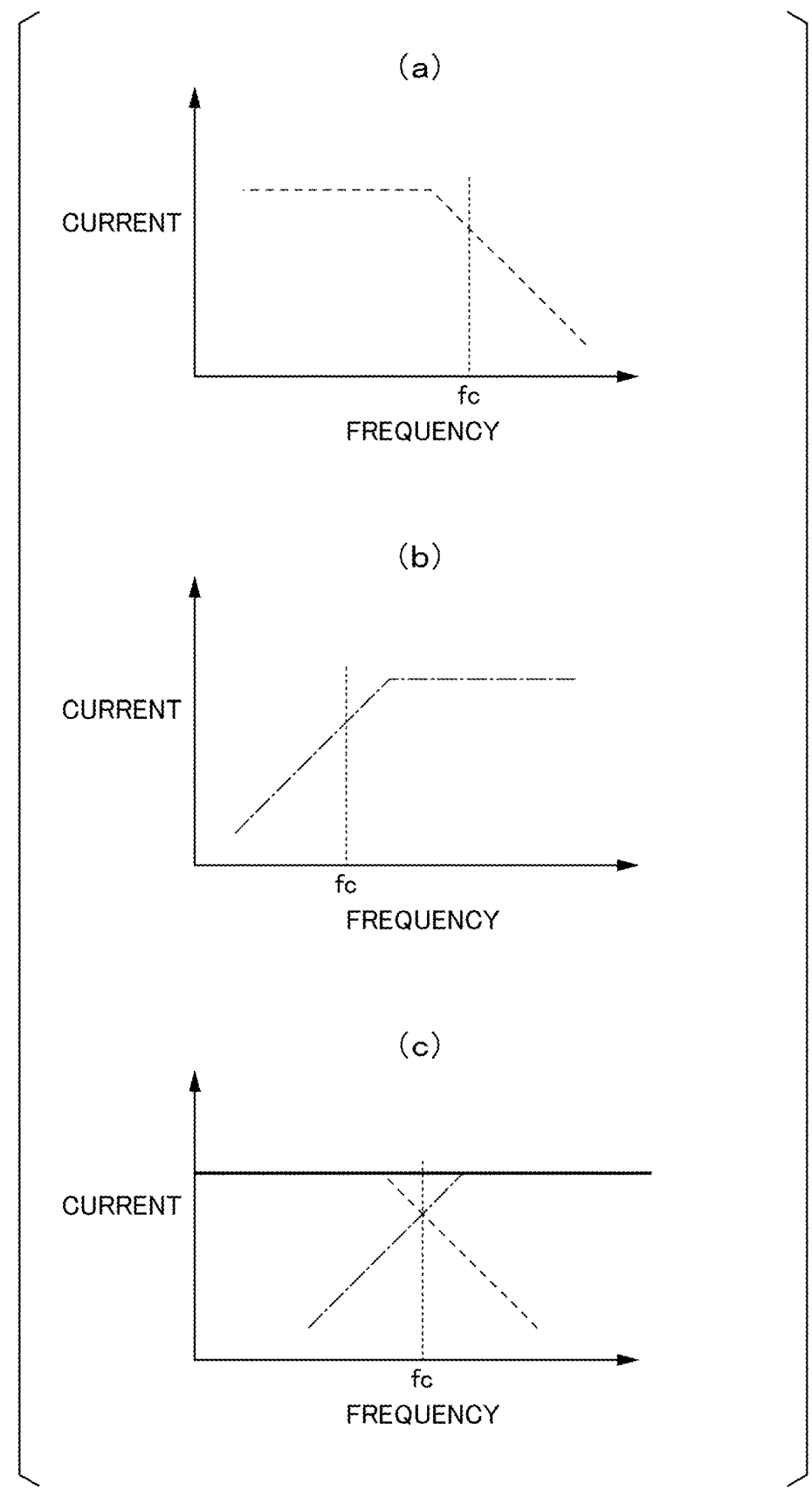
FIG. 3 is a diagram for describing a process performed by a synthesizer of a circuit in the first embodiment of the present invention.

FIG. 3 is a diagram for describing a process performed in the synthesizer of the circuit in the first embodiment of the present invention. Further, FIG. 3(a) is a diagram showing an example of a filter characteristic of the low-pass filter 23a. FIG. 3(b) is a diagram showing an example of a filter characteristic of the high-pass filter 23b. FIG. 3(c) is a diagram showing an example of a frequency characteristic of the synthesizer.

As shown in FIGS. 3(a) and 3(b), cutoff frequencies of the low-pass filter 23a and the high-pass filter 23b are both fc. That is, the low-pass filter 23a generally has characteristics of removing a component of a frequency higher than the cutoff frequency fc and passing a component of a frequency lower than the cutoff frequency fc. Also, the high-pass filter 23b generally has characteristics of removing a component of a frequency lower than the cutoff frequency fc and passing a component of a frequency higher than the cutoff frequency fc.

As shown in FIG. 3(c), the frequency characteristic of the synthesizer 23 is a characteristic obtained by synthesizing the characteristic shown in FIG. 3(a) with the characteristic shown in FIG. 3(b) so that the characteristic is flat at and near the cutoff frequency fc. That is, the frequency characteristic of the synthesizer 23 is a frequency characteristic in which the peak value of the AC from the low frequency to the high frequency is flat and the peak value (the current value) of the DC is approximately the same as the peak value of the AC flattened in the frequency characteristic.

Here, in order for a signal after the synthesis process of the synthesizer 23 (the result of measuring the current I) to reproduce the current I flowing through the conductor MC to be measured, a relationship of $<(1/fc) \times (1/100)$ is required to be satisfied as a relationship between the delay time $t_{delay}$ of the magnetic sensor SE1 and the cutoff frequency fc described above. Further, the delay time $t_{delay}$ is a time period required for the magnetic sensor SE1 to output the detection result after the current flowing through the conductor MC to be measured changes (i.e., after the magnetic field applied to the magnetic sensor SE1 changes).

The outputter 24 externally outputs the signal after the synthesis process of the synthesizer 23 (the result of measuring the current I). Further, the outputter 24 may include, for example, an output terminal that externally outputs the signal indicating the result of measuring the current I or may include a display device (for example, a liquid crystal display device) that externally displays the result of measuring the current I.

Here, as shown in FIGS. 1 and 2, the circuit 20 is separated from the sensor head 10 and is connected to the sensor head 10 via the cable CB. According to such a configuration, it is possible to separate a magnetic field detection function (the magnetic sensor SE1 and the Rogowski sensor SE2) and a calculation function (the calculators 21 and 22, the synthesizer 23, and the outputter 24). Thereby, the handling of the sensor head 10 can be facilitated, and for example, the sensor head 10 can be easily installed at a small place. Also, it is possible to avoid various problems (for example, temperature characteristics and dielectric strength) and the like that occur when the calculation function is provided in the sensor head 10, so that the application of the current measurement device 1 can be expanded.

<Operation of Current Measurement Device>

Next, an operation when the current I flowing through the conductor MC to be measured using the current measurement device 1 is measured will be described. First, the user of the current measurement device 1 fixes the sensor head 10 to the conductor MC to be measured using the fixing mechanism FM as shown in FIG. 1 so that the current I flowing through the conductor MC to be measured is measured. Thereby, the distance of the magnetic sensor SE1 with respect to the conductor MC to be measured is set to the distance r.

Also, as shown in FIG. 1, the user of the current measurement device 1 arranges the Rogowski sensor SE2 in a state in which the circumference of the conductor MC to be measured is surrounded thereby. At this time, the user of the current measurement device 1 may remove one end E1 of the Rogowski sensor SE2 from the sensor head 10 if necessary, arrange the Rogowski sensor SE2 in the above state, and then attach the one end E1 of the Rogowski sensor SE2 to the sensor head 10.

Figure 4:
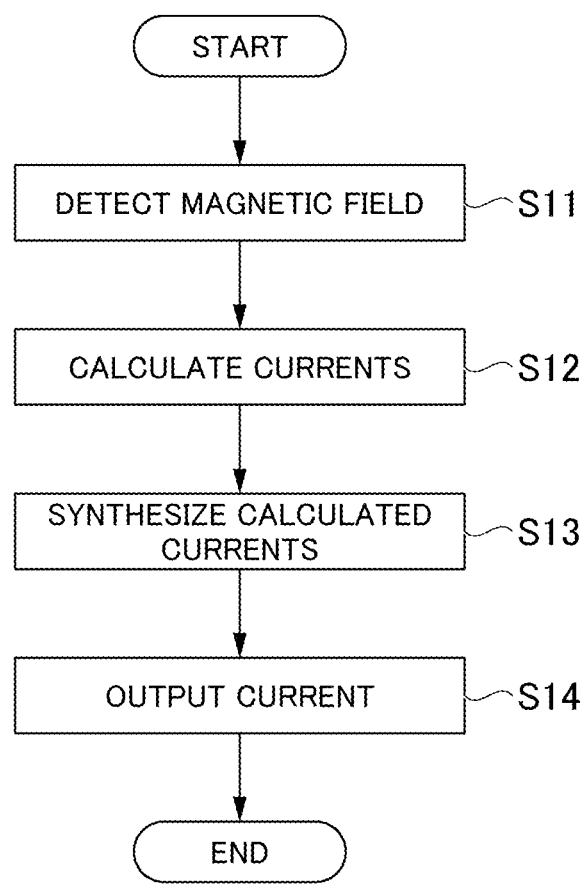
FIG. 4 is a flowchart showing an overview of an operation of the current measurement device according to the first embodiment of the present invention.

FIG. 4 is a flowchart showing an overview of the operation of the current measurement device according to the first embodiment of the present invention. The flowchart shown in FIG. 4 is repeated, for example, at certain intervals (for example, 1 second). When the process of the flowchart shown in FIG. 4 is started, the magnetic sensor SE1 and the Rogowski sensor SE2 first detect a magnetic field formed due to the current I flowing through the conductor MC to be measured (step S11).

Next, the calculators 21 and 22 calculate currents I flowing through the conductor MC to be measured from detection results of the magnetic sensor SE1 and the Rogowski sensor SE2 (step S12). Specifically, the calculator 21 calculates the current I (a DC and low-frequency component) flowing through the conductor MC to be measured by calculating a product of a distance r indicated by the distance information stored in the calculator 21, the detection result (the magnetic field H) of the magnetic sensor SE1, and a constant ($2\pi$). Also, the calculator 22 calculates the current I (components from a low frequency to a high frequency) flowing through the conductor MC to be measured by performing a calculation operation of converting the detection result (a voltage) of the Rogowski sensor SE2 into a current.

Subsequently, the synthesizer 23 synthesizes currents calculated by the calculators 21 and 22 (step S13). Specifically, first, a calculation result of the calculator 21 is input to the low-pass filter 23a to remove a high-frequency component, and a calculation result of the calculator 22 is input to the high-pass filter 23b to remove a low-frequency component. Subsequently, the signal level adjuster 23c adjusts levels of a signal output from the low-pass filter 23a (a low-frequency component that has passed through the low-pass filter 23a) and a signal output from the high-pass filter 23b (a high-frequency component that has passed through the high-pass filter 23b).

The adder 23d adds the signal whose signal level has been adjusted by the signal level adjuster 23c to the signal output from the high-pass filter 23b. In this way, the currents calculated by the calculators 21 and 22 are synthesized. When the above process is completed, the outputter 24 outputs a current after the synthesis process of the synthesizer 23 (step S14).

As described above, in the present embodiment, the magnetic sensor SE1 configured to detect a DC magnetic field and a low-frequency AC magnetic field generated due to the current flowing through the conductor MC to be measured and the Rogowski sensor SE2 configured to detect AC magnetic fields from a low frequency to a high frequency generated due to the current flowing through the conductor MC to be measured are provided. The current (a DC and a low-frequency AC) flowing through the conductor MC to be measured is calculated from a detection result of the magnetic sensor SE1 using distance information indicating the distance r between the magnetic sensor SE1 and the conductor MC to be measured, the current (from a low frequency to a high frequency) flowing through the conductor MC to be measured is calculated from a detection result of the Rogowski sensor SE2, and calculation results are synthesized. Thus, in the present embodiment, the DC and the AC can be measured wirelessly in a small size.

Second Embodiment

<Configuration of Current Measurement Device>

Figure 5:
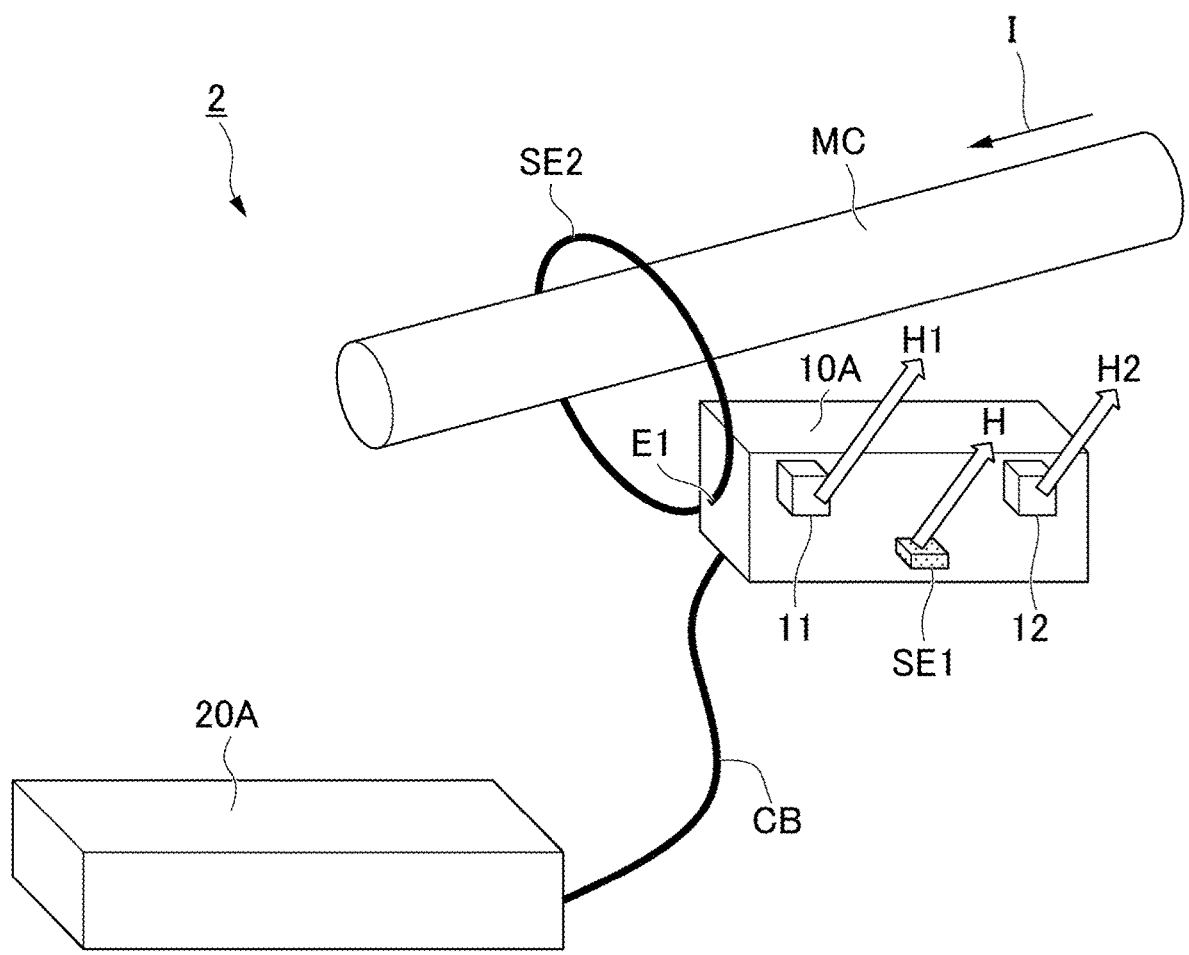
FIG. 5 is a diagram schematically showing a current measurement device according to a second embodiment of the present invention.

FIG. 5 is a diagram schematically showing a current measurement device according to a second embodiment of the present invention. In FIG. 5, the same reference signs are given to components corresponding to the components shown in FIG. 1. As shown in FIG. 5, a current measurement device 2 of the present embodiment includes a sensor head 10A and a circuit 20A connected by a cable CB and measures a current I flowing through a conductor MC to be measured wirelessly.

Like the sensor head 10 shown in FIG. 1, the sensor head 10A is a member for measuring the current I flowing through the conductor MC to be measured wirelessly, and is formed by a material (for example, a resin or the like) that does not block a magnetic field generated due to the current I. The sensor head 10A has a configuration in which the fixing mechanism FM of the sensor head 10 shown in FIG. 1 is omitted and two triaxial magnetic sensors 11 and 12 are added. The two triaxial magnetic sensors 11 and 12 are provided to calculate a distance of the magnetic sensor SE1 with respect to the conductor MC to be measured.

The triaxial magnetic sensors 11 and 12 are magnetic sensors having magnetism sensing directions on three axes orthogonal to each other. The triaxial magnetic sensors 11 and 12 are arranged at prescribed intervals so that their magnetism sensing directions are parallel to each other. For example, first axes of the triaxial magnetic sensors 11 and 12 are parallel, second axes of the triaxial magnetic sensors 11 and 12 are parallel, third axes of the triaxial magnetic sensors 11 and 12 are parallel, and they are arranged to be separated a prescribed distance in a prescribed direction. Further, hereinafter, it is assumed that the triaxial magnetic sensors 11 and 12 are arranged to be separated the prescribed distance in a first axis direction.

Further, the magnetism sensing directions of the triaxial magnetic sensors are not limited to those orthogonal to each other as in the present embodiment and may intersect at any angle as long as they intersect each other at a known angle. Also, the plurality of triaxial magnetic sensors are not limited to those arranged so that their magnetism sensing directions are parallel to each other as in the present embodiment and may be triaxial magnetic sensors arranged at any angle to each other so that the magnetism sensing directions are known.

Also, the triaxial magnetic sensors 11 and 12 are arranged so that a magnetism sensing direction and a relative position have a prescribed relationship with the magnetic sensor SE1. An example of positional relationships of the triaxial magnetic sensors 11 and 12 with respect to the magnetic sensor SE1 will be described below. Further, the number of triaxial magnetic sensors provided in the sensor head 10A is not limited to two and it is only necessary for the number of triaxial magnetic sensors provided in the sensor head 10A to be two or more. For example, in the sensor head 10A, three or four triaxial magnetic sensors may be provided.

Each of signals indicating the detection results of the triaxial magnetic sensors 11 and 12 may be either an analog signal or a digital signal. However, when each of the signals indicating the detection results of the triaxial magnetic sensors 11 and 12 is a digital signal, the number of signal lines included in the cable CB connecting the sensor head 10A and the circuit 20A can be reduced. For example, when each of the signals indicating the detection results of the triaxial magnetic sensors 11 and 12 is an analog signal, three signal lines for outputting triaxial detection results are required for each of the triaxial magnetic sensors 11 and 12 and hence a total of six signal lines are required. On the other hand, when each of the signals indicating the detection results of the triaxial magnetic sensors 11 and 12 is a digital signal, only one signal line is required. When the number of signal lines included in the cable CB is small, the flexibility of the cable CB is improved, so that handling becomes easy, for example, when the sensor head 10A is arranged in a small space.

The triaxial magnetic sensors 11 and 12 with low noise are used to calculate the distance of the magnetic sensor SE1 with respect to the conductor MC to be measured with high accuracy. For example, each of the triaxial magnetic sensors 11 and 12 in which a magnitude of the noise component included in the detection result thereof is 1/10 or less of a magnitude of the noise component included in the detection result of the magnetic sensor SE1 is used.

The circuit 20A measures the current I flowing through the conductor MC to be measured on the basis of detection results (detection results of the magnetic sensor SE1 and the Rogowski sensor SE2) output from the sensor head 10A. Here, as described in the first embodiment, distance information indicating the distance r between the magnetic sensor SE1 and the conductor MC to be measured is required when the current I (a DC and low-frequency component) is calculated on the basis of the detection result of the magnetic sensor SE1. The circuit 20A calculates the above-described distance information on the basis of the detection results of the triaxial magnetic sensors 11 and 12. Like the circuit 20 shown in FIG. 1, the circuit 20A externally outputs or displays the measurement result of the current I.

Figure 6:
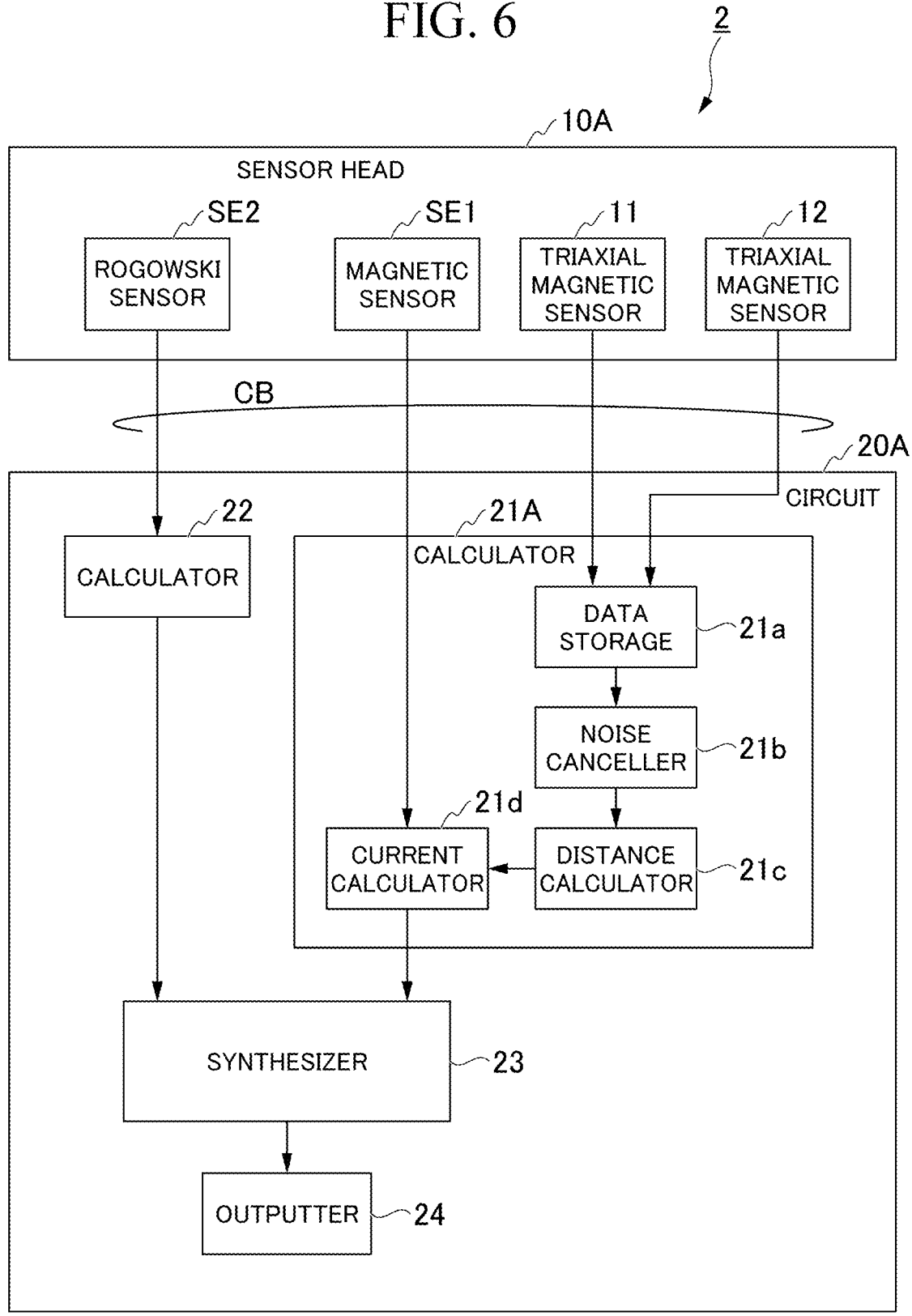
FIG. 6 is a block diagram showing a main configuration of the current measurement device according to the second embodiment of the present invention.

FIG. 6 is a block diagram showing a main configuration of the current measurement device according to the second embodiment of the present invention. Further, in FIG. 6, the same reference signs are given to blocks corresponding to the components shown in FIG. 2. Hereinafter, details of an internal configuration of the circuit 20A will be mainly described with reference to FIG. 6. As shown in FIG. 6, the circuit 20A has a configuration in which a calculator 21A (a first calculator) is provided in place of the calculator 21 shown in FIG. 2. Because the calculator 22, the synthesizer 23, and the outputter 24 shown in FIG. 6 are the same as those shown in FIG. 2, description thereof will be omitted.

The calculator 21A calculates a current I (a DC and low-frequency component) flowing through the conductor MC to be measured from the detection result of the magnetic sensor SE1 and the detection results of the triaxial magnetic sensors 11 and 12. The calculator 21A includes a data storage 21a, a noise canceller 21b, a distance calculator 21c (a distance information calculator), and a current calculator 21d.

The data storage 21a includes, for example, a volatile or non-volatile semiconductor memory, and stores the detection results of the triaxial magnetic sensors 11 and 12 output from the sensor head 10A. The data storage 21a may include an auxiliary storage device such as a hard disk drive (HDD) or a solid-state drive (SSD) in addition to the above-mentioned semiconductor memory (or in place of the above-mentioned semiconductor memory).

The noise canceller 21b removes noise components included in the detection results of the triaxial magnetic sensors 11 and 12. Specifically, the noise canceller 21b removes the noise components included in the detection results of the triaxial magnetic sensors 11 and 12 by individually performing an averaging process or a root sum square process on a plurality of detection results obtained from the triaxial magnetic sensors 11 and 12 for every prescribed certain period (for example, 1 second). Further, although the detection results of the three axes are output from the triaxial magnetic sensors 11 and 12, respectively, the noise component is removed by the noise canceller 21b individually for the detection result of each axis. Such noise removal is performed to improve SN ratios (signal-to-noise ratios) of the triaxial magnetic sensors 11 and 12 and improve the accuracy of calculation of the distance r of the magnetic sensor SE1 with respect to the conductor MC to be measured.

The distance calculator 21c calculates (estimates) the distance r of the magnetic sensor SE1 with respect to the conductor MC to be measured on the basis of the detection results of the triaxial magnetic sensors 11 and 12, the distance between the triaxial magnetic sensors 11 and 12, and the positional relationship of the triaxial magnetic sensors 11 and 12 with respect to the magnetic sensor SE1. This distance r is calculated because the distance information indicating the distance r is required when the current I (a DC and low-frequency component) is calculated on the basis of the detection result of the magnetic sensor SE1. Further, details of a process performed by the distance calculator 21c will be described below.

The current calculator 21d calculates the current I (a DC and low-frequency component) flowing through the conductor MC to be measured. Specifically, the current calculator 21d calculates the current I (the DC and low-frequency component) flowing through the conductor MC to be measured by calculating a product of the distance r indicated in the distance information calculated by the distance calculator 21c, the detection result (the magnetic field H) of the magnetic sensor SE1, and a constant ($2\pi$).

<Distance Calculation Method>

Figure 7:
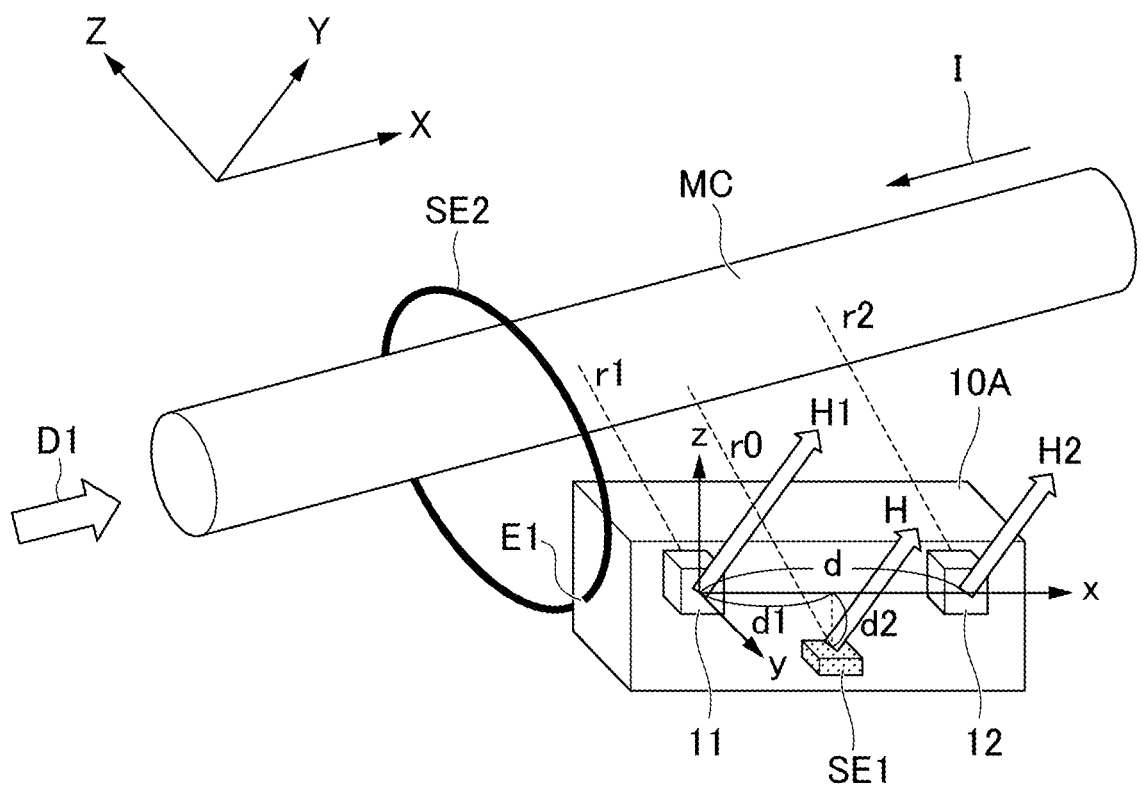
FIG. 7 is a diagram for describing an example of a method of calculating a distance of a magnetic sensor with respect to a conductor to be measured in the second embodiment of the present invention.

FIG. 7 is a diagram for describing an example of a method of calculating the distance of the magnetic sensor with respect to the conductor to be measured in the second embodiment of the present invention. First, as shown in FIG. 7, two coordinate systems such as a coordinate system (an xyz orthogonal coordinate system) related only to the sensor head 10A and a coordinate system (an XYZ orthogonal coordinate system) related to both the conductor MC to be measured and the sensor head 10A are set. Further, although the XYZ orthogonal coordinate system is shown in a state in which the origin position is shifted for convenience of illustration, a position of the origin of the XYZ orthogonal coordinate system is the same as a position of the origin of the xyz orthogonal coordinate system.

The xyz orthogonal coordinate system is a coordinate system defined according to a position and orientation of the sensor head 10A. In this xyz orthogonal coordinate system, the origin is set at the position of the triaxial magnetic sensor 11, the x-axis is set in an arrangement direction (the first axis direction) of the triaxial magnetic sensors 11 and 12, the y-axis is set in a second axis direction of the magnetic sensors 11 and 12, and the z-axis is set in a third axis direction of the triaxial magnetic sensors 11 and 12.

It is assumed that an interval between the triaxial magnetic sensors 11 and 12 in the x-direction is d [in]. Accordingly, it can be said that the triaxial magnetic sensor 11 is arranged at coordinates (0, 0, 0) of the xyz orthogonal coordinate system and the triaxial magnetic sensor 12 is arranged at coordinates (d, 0, 0) of the xyz orthogonal coordinate system. Also, it is assumed that an interval between the magnetic sensor SE1 and the triaxial magnetic sensor 11 in the x-direction is d1 [m], an interval between the magnetic sensor SE1 and the triaxial magnetic sensor 11 in the z-direction is d2 [m], and the magnetic sensor SE1 is arranged on the −z side of the triaxial magnetic sensor 11. Accordingly, it can be said that the magnetic sensor SE1 is arranged at coordinates (d1, 0, −d2) of the xyz orthogonal coordinate system.

The XYZ coordinate system is a coordinate system defined in accordance with a relative positional relationship between the conductor MC to be measured and the sensor head 10A. In this XYZ orthogonal coordinate system, the origin is set at the position of the triaxial magnetic sensor 11, the X-axis is set to be parallel to a longitudinal direction (a direction of the current I) of the conductor MC to be measured, and the Y-axis is set in the direction of the magnetic field H1 at the origin position (the position of the triaxial magnetic sensor 11). Further, the Z-axis is set in a direction orthogonal to the X-axis and the Y-axis.

As shown in FIG. 7, the distance of the triaxial magnetic sensor 11 with respect to the conductor MC to be measured is denoted by r1 and the distance of the triaxial magnetic sensor 12 with respect to the conductor MC to be measured is denoted by r2. Further, the distance r1 is a length of a line segment drawn vertically from the triaxial magnetic sensor 11 to the conductor MC to be measured and the distance r2 is a length of a line segment drawn vertically from the triaxial magnetic sensor 12 to the conductor MC to be measured. Also, a magnetic field formed at the position of the triaxial magnetic sensor 11 due to the current I is denoted by H1 and a magnetic field formed at the position of the triaxial magnetic sensor 12 due to the current I is denoted by H2. Here, it should be noted that the magnetic fields H1 and H2 can be detected by the triaxial magnetic sensors 11 and 12 but the distances r1 and r2 cannot be detected only with the magnetic fields H1 and H2.

Figure 8:
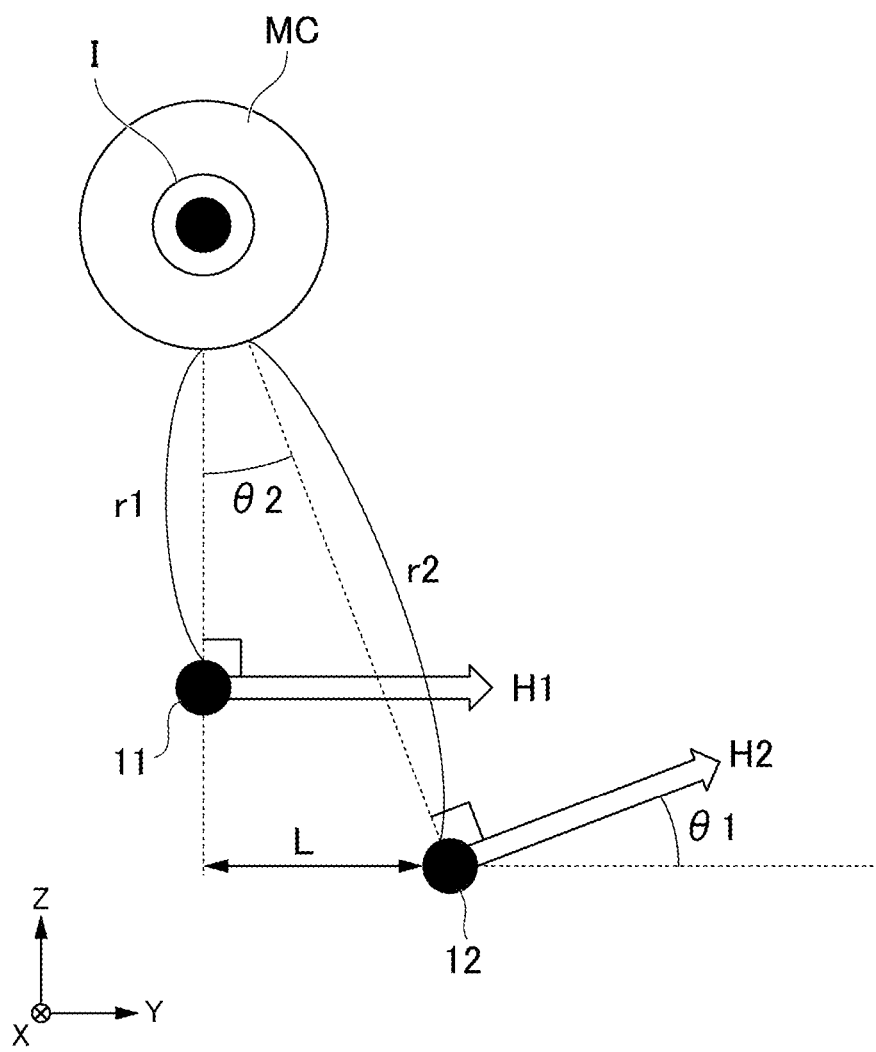
FIG. 8 is a view of the conductor to be measured and a triaxial magnetic sensor as viewed from the direction D1 in FIG. 7.

FIG. 8 is a view of the conductor to be measured and the triaxial magnetic sensor as viewed from a direction D1 in FIG. 7. The direction D1 in FIG. 7 is a direction along the longitudinal direction of the conductor MC to be measured (a direction opposite to a direction in which the current I flows). Further, in FIG. 8, the conductor MC to be measured and the triaxial magnetic sensors 11 and 12 are shown by omitting the illustration of the sensor head 10A for easy understanding. Also, also in FIG. 8, as in FIG. 7, the XYZ orthogonal coordinate system is shown in a state in which the origin position is shifted.

As shown in FIG. 8, the magnetic fields H1 and H2 formed at the positions of the triaxial magnetic sensors 11 and 12 due to the current I flowing in the X-direction (a −X-direction) perpendicular to the paper surface are orthogonal to the X-axis. Accordingly, as shown in FIG. 8, the magnetic fields H1 and H2 formed at the positions of the triaxial magnetic sensors 11 and 12 can be projected on a YZ plane orthogonal to the direction in which the current I flows in a state in which magnitudes thereof do not change.

The magnetic field H1 formed at the position of the triaxial magnetic sensor 11 is orthogonal to the line segment perpendicularly drawn from the triaxial magnetic sensor 11 to the conductor MC to be measured. Also, the magnetic field H2 formed at the position of the triaxial magnetic sensor 12 is orthogonal to a line segment perpendicularly drawn from the triaxial magnetic sensor 12 to the conductor MC to be measured. Accordingly, an angle θ2 formed by the above line segments is equal to an angle θ1 formed by the magnetic field H1 and the magnetic field H2. Thus, an interval L between the triaxial magnetic sensors 11 and 12 in the Y-direction is expressed by the following Eq. (1).

[Math. 1]

$$L = r2 \cdot \sin\theta 1 \quad (1)$$

Here, as described above, the above-described angle θ1 is an angle formed by the magnetic field H1 and the magnetic field H2 represented by vectors. Thus, the angle θ1 is expressed by the following Eq. (2) using a vector-related inner product formula.

[Math. 2]

$$H1 \cdot H2 = |H1||H2|\cos\theta 1 \quad (2)$$

By modifying the above Eq. (2) and substituting Eq. (2), which has been modified, into the above Eq. (1), the following Eq. (3) can be obtained.

[Math. 3]

$$r2 = \frac{L}{\sin\theta 1} = \frac{L}{\sqrt{1 - \left(\frac{H1 \cdot H2}{|H1||H2|}\right)^2}} \quad (3)$$

The magnetic fields H1 and H2 in the above Eq. (3) are detection results of the triaxial magnetic sensors 11 and 12. Thus, if the above-described interval L is known, the distance r2 of the triaxial magnetic sensor 12 with respect to the conductor MC to be measured can be calculated. Hereinafter, a method of calculating the interval L in the Y-direction of the triaxial magnetic sensors 11 and 12 required for calculating the distance r2 will be described.

FIG. 9 is a diagram for describing a method of calculating the interval L in the Y-direction of the triaxial magnetic sensor. Further, FIG. 9(a) is a view of the xyz coordinate system viewed in a direction from the +z side to the −z side, FIG. 9(b) is a view of the xyz coordinate system viewed in a direction from the +x side to the −x side, and FIG. 9(c) is a view of the xyz coordinate system viewed in a direction from the +y side to the −y side. In the present embodiment, an operation of rotating the XYZ coordinate system and causing the XYZ coordinate system to match the xyz coordinate system is performed and the interval L between the triaxial magnetic sensors 11 and 12 in the Y-direction is calculated. By performing such an operation, the magnetic field at the position of the triaxial magnetic sensor 11 has only the y component and the conductor MC to be measured becomes orthogonal to the yz plane (parallel to the x-axis).

Specifically, first, as shown in FIG. 9(a), an operation of rotating the XYZ coordinate system by an angle α around the z-axis and arranging the magnetic field H1 (the Y-axis) on the yz plane is performed. Here, assuming that the x component of the magnetic field H1 detected by the triaxial magnetic sensor 11 is denoted by H1x, the y component is denoted by H1y, and the z component is denoted by H1z, the above angle α is represented by the following Eqs. (4). Also, a position P1 of the triaxial magnetic sensor 12 after such an operation is performed is represented by the following Eq. (5).

[Math. 4]

$$\cos\alpha = \frac{H1_y}{\sqrt{H1_x^2 + H1_y^2}} \qquad (4)$$

$$\sin\alpha = \frac{H1_x}{\sqrt{H1_x^2 + H1_y^2}}$$

[Math. 5]

$$P1 = (d\cos\alpha, d\sin\alpha, 0) \qquad (5)$$

Next, as shown in FIG. 9(b), an operation of rotating the XYZ coordinate system around the x-axis by an angle β and arranging the magnetic field H1 (the Y-axis) on the y-axis is performed. The above angle β is represented by the following Eq. (6). Also, a position P2 of the triaxial magnetic sensor 12 after such an operation is performed is represented by the following Eq. (7).

[Math. 6]

$$\cos\beta = \frac{\sqrt{H1_x^2 + H1_y^2}}{|H1|} \qquad (6)$$

$$\sin\beta = \frac{H1_z}{|H1|}$$

[Math. 7]

$$P2 = (d\cos\alpha, d\sin\alpha\cos\beta, d\sin\alpha\sin\beta) \qquad (7)$$

Next, as shown in FIG. 9(c), an operation of rotating the XYZ coordinate system around the y-axis by an angle γ and causing the conductor MC to be measured to be orthogonal to the yz plane is performed. At this time, because the y-coordinate does not change, a y-coordinate of a position P3 of the triaxial magnetic sensor 12 after such an operation is performed is d·sin α·cos β.

By performing the above operation, the interval L between the triaxial magnetic sensors 11 and 12 in the Y-direction (the y-direction) becomes equal to the y coordinate (d·sin α·cos β) of the position P3 of the triaxial magnetic sensor 12. Then, the above Eq. (3) can be modified to the following Eq. (8) using the above Eqs. (4) and the above Eqs. (6). Referring to this Eq. (8), it can be seen that the distance r2 of the triaxial magnetic sensor 12 with respect to the conductor MC to be measured is calculated (estimated) from the detection results of the triaxial magnetic sensors 11 and 12 and the interval d between the triaxial magnetic sensors 11 and 12.

[Math. 8]

$$r2 = d \times \frac{H1_x}{|H1|} \times \frac{1}{\sqrt{1 - \left(\frac{H1 \cdot H2}{|H1||H2|}\right)^2}} \qquad (8)$$

Further, here, an example in which the above-described operation is performed on the xyz orthogonal coordinate system and the XYZ orthogonal coordinate system in which the origin is set at the position of the triaxial magnetic sensor 11 and the distance r2 of the triaxial magnetic sensor 12 with respect to the conductor MC to be measured is calculated has been described. If the positions of the origins of the xyz orthogonal coordinate system and the XYZ orthogonal coordinate system are set at the position of the triaxial magnetic sensor 12 and an operation similar to the above-described operation is performed, the distance r1 of the triaxial magnetic sensor 11 with respect to the conductor MC to be measured is also calculated (estimated).

As described above, positional relationships of the triaxial magnetic sensors 11 and 12 with respect to the magnetic sensor SE1 are prescribed. Thus, if the distance r1 of the triaxial magnetic sensor 11 with respect to the conductor MC to be measured and the distance r2 of the triaxial magnetic sensor 12 with respect to the conductor MC to be measured are calculated, the distance r of the magnetic sensor SE1 with respect to the conductor MC to be measured is calculated (estimated). Further, it should be noted that the method of calculating the distance r described above is merely an example. For example, a different calculation method may be used in accordance with the number of triaxial magnetic sensors provided in the sensor head 10A and the like.

<Operation of Current Measurement Device>

Next, the operation when measuring the current I flowing through the conductor MC to be measured using the current measurement device 2 will be described. First, the user of the current measurement device 2 arranges the sensor head 10A near the conductor MC to be measured so that the current I flowing through the conductor MC to be measured can be measured. Further, the position and orientation of the sensor head 10A with respect to the conductor MC to be measured are arbitrary.

Also, as shown in FIG. 5, the user of the current measurement device 2 arranges the Rogowski sensor SE2 in a state in which the circumference of the conductor MC to be measured is surrounded thereby. At this time, the user of the current measurement device 2 may remove one end E1 of the Rogowski sensor SE2 from the sensor head 10A if necessary, arrange the Rogowski sensor SE2 in the above state, and then attach the one end E1 of the Rogowski sensor SE2 to the sensor head 10A.

An operation of the current measurement device 2 when the current I flowing through the conductor MC to be measured is measured is basically similar to the operation of the current measurement device 1 of the first embodiment. That is, when the current I flowing through the conductor MC to be measured is measured, the current measurement device 2 performs an operation according to the process of the flowchart shown in FIG. 4. However, the current measurement device 2 additionally performs a distance calculation process of calculating the distance r of the magnetic sensor SE1 with respect to the conductor MC to be measured on the basis of the detection results of the triaxial magnetic sensors 11 and 12.

FIG. 10 is a flowchart showing a distance calculation process performed in the second embodiment of the present invention. The flowchart shown in FIG. 10 is repeated, for example, at certain intervals (for example, 1 second). Further, the process shown in FIG. 10 is performed in parallel with the processing of steps S11 and S12 shown in FIG. 4.

When the process of the flowchart shown in FIG. 10 is started, the triaxial magnetic sensors 11 and 12 first detect a magnetic field formed due to a current I flowing through the conductor MC to be measured (step S21). Further, a magnetic field is detected by the triaxial magnetic sensors 11 and 12, for example, about 1000 times per second. Next, the data storage 21a of the circuit 20A stores detection data indicating detection results of the triaxial magnetic sensors 11 and 12 (step S22).

Next, the noise canceller 21b performs a process of removing noise from the detection data (step S23). Specifically, the detection data stored in the data storage 21a is read by the noise canceller 21b and a process of removing a noise component included in the detection data is performed by performing an averaging process or a root sum square process on the read detection data. Further, because a sign is removed when the root sum square process is performed, the sign is added separately. Here, the triaxial magnetic sensors 11 and 12 output three types of detection data for outputting detection results of the three axes, respectively. The noise component is removed by the noise canceller 21b individually with respect to the detection data of each axis.

Subsequently, the distance calculator 21c calculates a distance r of the magnetic sensor SE1 with respect to the conductor MC to be measured (step S24). Specifically, the distance calculator 21c calculates a distance r2 of the triaxial magnetic sensor 12 with respect to the conductor MC to be measured by performing a calculation operation indicated in the above-described Eq. (8) using the detection data from which noise has been removed in step S23 and data indicating an interval d between the triaxial magnetic sensors 11 and 12, which has been input in advance. Likewise, the distance calculator 21c calculates a distance r1 of the triaxial magnetic sensor 11 with respect to the conductor MC to be measured.

The distance calculator 21c calculates the distance r of the magnetic sensor SE1 with respect to the conductor MC to be measured using data indicating an interval d1 in the x-direction and an interval d2 in the z-direction between the magnetic sensor SE1 and the triaxial magnetic sensor 11 and the distance r1 of the triaxial magnetic sensor 11 and the distance r2 of the axial magnetic sensor 12 with respect to the conductor MC to be measured. Further, the current calculator 21d calculates a product of the distance r indicated by the distance information calculated by the distance calculator 21c, the detection result (the magnetic field H) of the magnetic sensor SE1, and the constant ($2\pi$) and calculates the current I (a DC and low-frequency component) flowing through the conductor MC to be measured.

As described above, even in the present embodiment, the magnetic sensor SE1 configured to detect a DC magnetic field and a low-frequency AC magnetic field generated due to the current flowing through the conductor MC to be measured and the Rogowski sensor SE2 configured to detect AC magnetic fields from a low frequency to a high frequency generated due to the current flowing through the conductor MC to be measured are provided. The current (a DC and a low-frequency AC) flowing through the conductor MC to be measured is calculated from a detection result of the magnetic sensor SE1 using distance information indicating the distance r between the magnetic sensor SE1 and the conductor MC to be measured, the current (from a low frequency to a high frequency) flowing through the conductor MC to be measured is calculated from a detection result of the Rogowski sensor SE2, and calculation results are synthesized. Thus, in the present embodiment, the DC and the AC can also be measured wirelessly in a small size.

Also, in the present embodiment, the distance r of the magnetic sensor SE1 with respect to the conductor MC to be measured is calculated using the detection data indicating the detection results of the triaxial magnetic sensors 11 and 12, the data indicating the interval d between the triaxial magnetic sensors 11 and 12, and the data indicating the positional relationships (intervals d1 and d2) of the triaxial magnetic sensors 11 and 12 with respect to the magnetic sensor SE1. A current (a DC and a low-frequency AC) flowing through the conductor MC to be measured is calculated from the detection result of the magnetic sensor SE1 using the distance information indicating the calculated distance r. Here, in the present embodiment, the position and orientation of the sensor head 10A with respect to the conductor MC to be measured may be arbitrary. Thus, in the present embodiment, the installation at the time of current measurement can be flexibly performed.

Although the current measurement device according to the embodiment of the present invention has been described above, the present invention is not limited to the above embodiment and can be freely changed within the scope of the present invention. For example, in the above-described embodiment, an example in which the triaxial magnetic sensors 11 and 12 are separated at an interval d [m] in the first axis direction (the x-axis direction) has been described. However, the triaxial magnetic sensors 11 and 12 may be separated in the second axis direction (the y-axis direction), may be separated in the third axis direction (the z-axis direction), or may be separated in other directions. That is, the direction in which the triaxial magnetic sensors 11 and 12 are separated is arbitrary.

Also, in the above-described embodiment, an example in which the distance r of the magnetic sensor SE1 with respect to the conductor MC to be measured is calculated using the two triaxial magnetic sensors 11 and 12 has been described. However, the distance r of the magnetic sensor SE1 with respect to the conductor MC to be measured may be calculated using three or more triaxial magnetic sensors.

Also, various processes described above according to each embodiment described above may be performed by recording a program for implementing some or all functions of the circuit 20 or 20A described in the present embodiment on a computer readable storage medium and causing a computer system to read and execute the program recorded on the storage medium. The "computer system" used here may include an operating system (OS) and hardware such as peripheral devices. Also, the "computer system" is assumed to include a homepage providing environment (or displaying environment) when a World Wide Web (WWW) system is used. Also, the "computer readable storage medium" refers to a storage device such as a flexible disc, a magneto-optical disc, a read-only memory (ROM), a writable non-volatile memory such as a flash memory, a portable medium such as a compact disc-ROM (CD-ROM), and a hard disk embedded in the computer system.

Furthermore, the "computer readable storage medium" is assumed to include a medium that holds a program for a certain period of time, such as a volatile memory (for example, a dynamic random access memory (DRAM)) inside a computer system serving as a server or a client when the program is transmitted via a network such as the Internet or a communication circuit such as a telephone circuit. Also, the above-described program may be transmitted from a computer system storing the program in a storage device or the like to another computer system via a transmission medium or by transmission waves in a transmission medium. Here, the "transmission medium" for transmitting the program refers to a medium having a function of transmitting information as in a network (a communication network) such as the Internet or a communication circuit (a communication line) such as a telephone circuit. Also, the above-described program may be a program for implementing some of the above-described functions. Further, the above-described program may be a program capable of implementing the above-described function in combination with a program already recorded on the computer system, i.e., a so-called differential file (differential program).

In the present description, terms indicating directions such as "front, back, up, down, right, left, vertical, horizontal, vertical, horizontal, row, and column" refer to the directions in the device of the present invention. Accordingly, these terms in the description of the present invention should be relatively interpreted in the device of the present invention.

The term "configuration" is configured to perform the function of the present invention or used to indicate a component, an element, or a part of a device.

Furthermore, the term "means plus function" in the claims should include any structure that can be used to perform the function included in the present invention.

The term "unit" is used to refer to a component, a unit, hardware, or a part of software programmed to perform a desired function. Typical examples of hardware are devices and circuits, but are not limited thereto.

Although preferred embodiments of the present invention have been described above, the present invention is not limited to these embodiments. Additions, omissions, substitutions, and other modifications can be made without departing from the spirit or scope of the present invention. Accordingly, the invention is not to be considered as being limited by the foregoing description, and is only limited by the scope of the appended claims.

REFERENCE SIGNS LIST 1, 2 Current measurement device
10, 10A Sensor head
11, 12 Triaxial magnetic sensor
20, 20A Circuit
21, 21A Calculator
21b Noise canceller
21c Distance calculator
22 Calculator
23 Synthesizer
23a Low-pass filter
23b High-pass filter
23c Signal level adjuster
23d Adder
I Current
FM Fixing mechanism
MC Conductor to be measured
SE1 Magnetic sensor
SE2 Rogowski sensor

The invention claimed is:

1. A current measurement device for measuring a current flowing through a conductor to be measured, the current measurement device comprising:
a first sensor configured to detect a direct current magnetic field and a low-frequency alternating current magnetic field generated due to the current flowing through the conductor to be measured;
a second sensor configured to detect alternating current magnetic fields from a low frequency to a high frequency generated due to the current flowing through the conductor to be measured;
a first calculator configured to calculate the current flowing through the conductor to be measured by calculating a product of a distance between the first sensor and the conductor to be measured, a detection result of the first sensor, and a constant, using distance information indicating the distance;
a second calculator configured to calculate the current flowing through the conductor to be measured from a detection result of the second sensor; and
a synthesizer configured to synthesize a calculation result of the first calculator with a calculation result of the second calculator.

2. The current measurement device according to claim 1, wherein the distance information is pre-stored in the first calculator, and
wherein the current measurement device further comprises a fixing mechanism configured to specify a distance of the first sensor with respect to the conductor to be measured as a distance indicated in the distance information pre-stored in the first calculator.

3. The current measurement device according to claim 2, further comprising:
a sensor head having the first sensor, the second sensor, and the fixing mechanism; and
a circuit having the first calculator, the second calculator, and the synthesizer.

4. The current measurement device according to claim 1, further comprising:
two or more triaxial magnetic sensors which are arranged so that a magnetism sensing direction and a relative position have a prescribed relationship with respect to the first sensor,
wherein the first calculator comprises a distance information calculator configured to calculate the distance information on the basis of detection results of the two or more triaxial magnetic sensors.

5. The current measurement device according to claim 4, wherein the first calculator further includes a noise canceller configured to remove noise components included in the detection results of the two or more triaxial magnetic sensors, and
wherein the distance information calculator calculates the distance information using the detection results of the two or more triaxial magnetic sensors from which the noise components are removed by the noise canceller.

6. The current measurement device according to claim 4, further comprises:
a sensor head having the first sensor, the second sensor, and the two or more triaxial magnetic sensors; and
a circuit having the first calculator, the second calculator, and the synthesizer.

7. The current measurement device according to claim 1, wherein the synthesizer comprises:
a first filter configured to remove a high-frequency component from the calculation result of the first calculator and pass a low-frequency component;
a second filter configured to remove a low-frequency component from the calculation result of the second calculator and pass a high-frequency component;
an adjuster configured to adjust at least one of a level of a first signal output from the first filter or a level of a second signal output from the second filter; and
an adder configured to perform an addition operation on the first signal and the second signal for which level adjustment has been performed by the adjuster.

8. A current measurement method that is executed by a current measurement device comprising a first sensor, a second sensor, a first calculator, a second calculator, and a synthesizer, the current measurement device being configured to measure a current flowing through a conductor to be measured, the current measurement method comprising:
detecting, by the first sensor, a direct current magnetic field and a low-frequency alternating current magnetic field generated due to the current flowing through the conductor to be measured;
detecting, by the second sensor, alternating current magnetic fields from a low frequency to a high frequency generated due to the current flowing through the conductor to be measured;
calculating, by the first calculator, the current flowing through the conductor to be measured by calculating a product of a distance between the first sensor and the conductor to be measured, a detection result of the first sensor, and a constant, using distance information indicating the distance;
calculating, by the second calculator, the current flowing through the conductor to be measured from a detection result of the second sensor; and
synthesizing, by the synthesizer, a calculation result of the first calculator with a calculation result of the second calculator.

9. The current measurement method according to claim 8, wherein the distance information is pre-stored in the first calculator, and
wherein the current measurement device further comprises a fixing mechanism configured to specify a distance of the first sensor with respect to the conductor to be measured as a distance indicated in the distance information pre-stored in the first calculator.

10. The current measurement method according to claim 9,
wherein the current measurement device further comprises:
a sensor head having the first sensor, the second sensor, and the fixing mechanism; and
a circuit having the first calculator, the second calculator, and the synthesizer.

11. The current measurement method according to claim 8,
wherein the current measurement device further comprises two or more triaxial magnetic sensors which are arranged so that a magnetism sensing direction and a relative position have a prescribed relationship with respect to the first sensor,
wherein the first calculator comprises a distance information calculator, and
wherein current measurement method further comprises:
calculating, by the distance information calculator, the distance information on the basis of detection results of the two or more triaxial magnetic sensors.

12. The current measurement method according to claim 11,
wherein the first calculator further comprises a noise canceller,
wherein the current measurement method further comprising:
removing, by the noise canceller, noise components included in the detection results of the two or more triaxial magnetic sensors; and
calculating, by the distance information calculator, the distance information using the detection results of the two or more triaxial magnetic sensors from which the noise components are removed by the noise canceller.

13. The current measurement method according to claim 11,
wherein the current measurement device further comprises:
a sensor head having the first sensor, the second sensor, and the two or more triaxial magnetic sensors; and
a circuit having the first calculator, the second calculator, and the synthesizer.

14. The current measurement method according to claim 8,
wherein the synthesizer comprises a first filter, a second filter, an adjuster, and an adder,
wherein the current measurement method further comprises:
removing, by the first filter, a high-frequency component from the calculation result of the first calculator and passing a low-frequency component;
removing, by the second filter, a low-frequency component from the calculation result of the second calculator and passing a high-frequency component;
adjusting, by the adjuster, at least one of a level of a first signal output from the first filter or a level of a second signal output from the second filter; and
performing, by the adder, an addition operation on the first signal and the second signal for which level adjustment has been performed by the adjuster.

15. A non-transitory computer readable storage medium storing one or more programs that are executed by a current measurement device that comprises a first sensor, a second sensor, a first calculator, a second calculator, and a synthesizer, the current measurement device being configured to measure a current flowing through a conductor to be measured, the one or more programs comprising instructions for:
detecting, by the first sensor, a direct current magnetic field and a low-frequency alternating current magnetic field generated due to the current flowing through the conductor to be measured;
detecting, by the second sensor, alternating current magnetic fields from a low frequency to a high frequency generated due to the current flowing through the conductor to be measured;
calculating, by the first calculator, the current flowing through the conductor to be measured by calculating a product of a distance between the first sensor and the conductor to be measured, a detection result of the first sensor, and a constant, using distance information indicating the distance;
calculating, by the second calculator, the current flowing through the conductor to be measured from a detection result of the second sensor; and synthesizing, by the synthesizer, a calculation result of the first calculator with a calculation result of the second calculator.

16. The non-transitory computer readable storage medium according to claim 15,
   wherein the distance information is pre-stored in the first calculator, and
   wherein the current measurement device further comprises a fixing mechanism configured to specify a distance of the first sensor with respect to the conductor to be measured as a distance indicated in the distance information pre-stored in the first calculator.

17. The non-transitory computer readable storage medium according to claim 16,
   wherein the current measurement device further comprises:
   a sensor head having the first sensor, the second sensor, and the fixing mechanism; and
   a circuit having the first calculator, the second calculator, and the synthesizer.

18. The non-transitory computer readable storage medium according to claim 15,
   wherein the current measurement device further comprises two or more triaxial magnetic sensors which are arranged so that a magnetism sensing direction and a relative position have a prescribed relationship with respect to the first sensor,
   wherein the first calculator comprises a distance information calculator, and
   wherein the one or more programs further comprising instructions for:
   calculating, by the distance information calculator, the distance information on the basis of detection results of the two or more triaxial magnetic sensors.

19. The non-transitory computer readable storage medium according to claim 18,
   wherein the first calculator further comprises a noise canceller,
   wherein the one or more programs further comprising instructions for:
   removing, by the noise canceller, noise components included in the detection results of the two or more triaxial magnetic sensors; and
   calculating, by the distance information calculator, the distance information using the detection results of the two or more triaxial magnetic sensors from which the noise components are removed by the noise canceller.

20. The non-transitory computer readable storage medium according to claim 18,
   wherein the current measurement device further comprises:
   a sensor head having the first sensor, the second sensor, and the two or more triaxial magnetic sensors; and
   a circuit having the first calculator, the second calculator, and the synthesizer.

* * * * *